United States Patent
Czerwiński et al.

(10) Patent No.: US 11,775,856 B2
(45) Date of Patent: Oct. 3, 2023

(54) QUANTUM LOGIC CIRCUIT WITH WEIGHTS AND METHODS FOR USE THEREWITH

(71) Applicant: BEIT Inc., Millbrae, CA (US)

(72) Inventors: Lukasz Czerwiński, Wieliczka (PL); Jan Tułowiecki, Giebułtów (PL); Adam Szady, Cracow (PL)

(73) Assignee: BEIT Inc., Millbrae, CA (US)

( * ) Notice: Subject to any disclaimer, the term of this patent is extended or adjusted under 35 U.S.C. 154(b) by 159 days.

(21) Appl. No.: 17/453,925

(22) Filed: Nov. 8, 2021

(65) Prior Publication Data

US 2022/0180237 A1 Jun. 9, 2022

Related U.S. Application Data

(60) Provisional application No. 63/123,226, filed on Dec. 9, 2020.

(51) Int. Cl.
*G06N 10/20* (2022.01)
*B82Y 10/00* (2011.01)
*H03K 19/195* (2006.01)

(52) U.S. Cl.
CPC ............. *G06N 10/20* (2022.01); *B82Y 10/00* (2013.01); *H03K 19/195* (2013.01)

(58) Field of Classification Search
None
See application file for complete search history.

(56) References Cited

U.S. PATENT DOCUMENTS

| | | | |
|---|---|---|---|
| 2006/0224547 A1* | 10/2006 | Ulyanov | B82Y 10/00 706/62 |
| 2017/0364796 A1 | 12/2017 | Wiebe | |
| 2018/0232649 A1 | 8/2018 | Wiebe et al. | |
| 2020/0184024 A1 | 6/2020 | Nam et al. | |
| 2022/0366314 A1* | 11/2022 | Vall-Ilosera | G06N 10/80 |

OTHER PUBLICATIONS

Kunzhang et al., Examples on quantum search algorithm with optimized depth, pp. 1-7, Dec. 11, 2019 (Year: 2019).*

(Continued)

*Primary Examiner* — Anh Q Tran
(74) *Attorney, Agent, or Firm* — GARLICK & MARKISON; Bruce E. Stuckman

(57) ABSTRACT

A quantum circuit includes a plurality of Hadamard gates apply Hadamard transforms to a plurality of qubits in a corresponding plurality of initial states. A plurality of weighted oracle gates sequentially call a weighted oracle operator on the plurality of qubits to produce a sequence of quantum oracle calls, wherein the weighted oracle operator for the plurality of qubits applies an adjustable phase rotation at each of the quantum oracle calls in the sequence of quantum oracle calls. A plurality of diffusion gates apply a plurality of diffusion operators, wherein a selected one or more of a plurality of diffusion operators is applied after each of the quantum oracle calls in the sequence of quantum oracle calls. A measurement function generates a quantum computing result based on a measurement from the plurality of qubits, after the sequence of quantum oracle calls are applied and after the plurality of diffusion operators are applied.

20 Claims, 6 Drawing Sheets

(56) References Cited

OTHER PUBLICATIONS

Hlembotskyi, et al.; Efficient Unstructured Search Implementation on Current Ion-Trap Quantum Processors; arXiv:2010.03841v1 [quant-ph], Oct. 8, 2020; pp. 1-10.
International Searching Authority; International Search Report and Written Opinion; International Application No. PCT/US2021/058549; dated Mar. 3, 2022; 10 pgs.
Zhang, et al.; Examples on quantum search algorithm with optimized depth; Dec. 11, 2019; 7 pgs [ISA retrieved on Jan. 12, 2022] from <http://insti.physics.sunysb.edu/~korepin/PDF-files/Circut.pdf>].
Satoh et al., Subdivided Phase Oracle for NISQ Search Algorithms; arXiv:2001.06575v3 [quant-ph] Mar. 31, 2020.

* cited by examiner 100 (Prior Art)

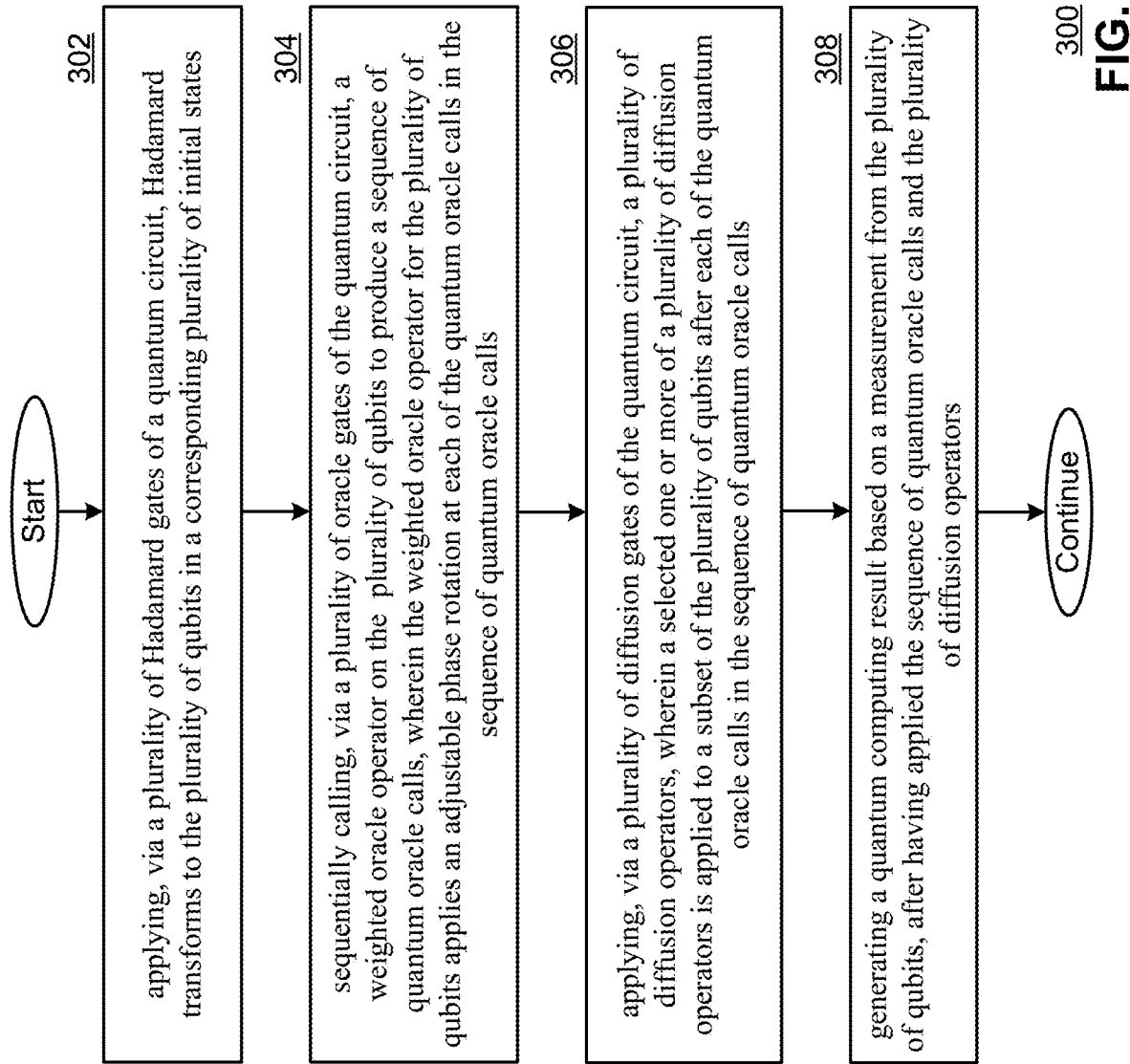

QUANTUM LOGIC CIRCUIT WITH WEIGHTS AND METHODS FOR USE THEREWITH

CROSS-REFERENCE TO RELATED APPLICATIONS

The present U.S. Utility Patent Application claims priority pursuant to 35 U.S.C. § 119(e) to U.S. Provisional Application No. 63/123,226, entitled "QUANTUM LOGIC CIRCUIT WITH WEIGHTS AND METHODS FOR USE THEREWITH", filed Dec. 9, 2020, which is hereby incorporated herein by reference in its entirety and made part of the present U.S. Utility Patent Application for all purposes.

BACKGROUND OF THE INVENTION

Technical Field of the Invention

This invention relates generally to computer systems and particularly to quantum computing techniques and circuits.

Description of Related Art

Computing devices are known to communicate data, process data, and/or store data. Such computing devices range from wireless smartphones, laptops, tablets, personal computers (PC), work stations, smart watches, connected cars, and video game devices, to web servers and data centers that support millions of web searches, web applications, or on-line purchases every day. In general, a computing device includes a processor, a memory system, user input/output interfaces, peripheral device interfaces, and an interconnecting bus structure.

Classical digital computing devices operate based on data encoded into binary digits (bits), each of which has one of the two definite binary states (i.e., 0 or 1). In contrast, a quantum computer utilizes quantum-mechanical phenomena to encode data as quantum bits or qubits, which can be in superpositions of the traditional binary states.

BRIEF DESCRIPTION OF THE SEVERAL VIEWS OF THE DRAWING(S)

FIG. 3 is a flow diagram of an embodiment of a method in accordance with various embodiments.

DETAILED DESCRIPTION OF THE INVENTION

Figure 1A:
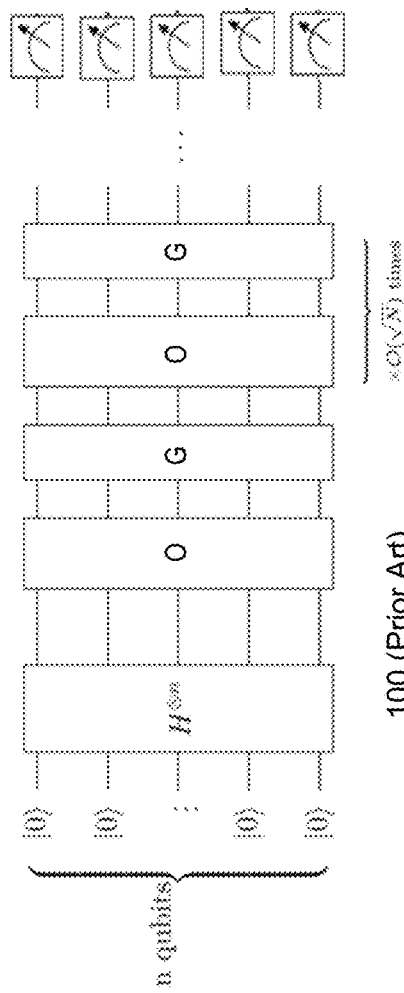
FIG. 1A is a schematic block diagram of a prior art quantum circuit.

FIG. 1A is a schematic block diagram 100 of a prior art quantum circuit. In particular, a quantum circuit implementation of Grover's algorithm is presented. Grover's algorithm is a quantum algorithm that finds, with high probability, a quantum solution. Grover's algorithm is based on the unique input to a black box function called a "quantum oracle", "oracle operator", "oracle function" or simply "oracle" that produces a particular output value. Grover's algorithm converges in just O(sqrt(N)) evaluations of the oracle function, where N is the size of the function's domain. Grover's algorithm has been applied to the problem of unstructured database search, or more generally the inversion of a function.

In operation, n qubits are initialized and applied to a corresponding number of Hadamard (H) gates. Each input is Hadamard transformed in order to achieve a uniform superposition of all the initial states. An oracle gate (O) performs an oracle call for each of the transformed qubit states and a diffusion gate (G) performs the Grover diffusion operator. This process is repeated O(sqrt(N)) times. A measurement of the qubits after this point yields the quantum solution with a probability that approaches 1 for large values of N. See e.g., John Wright, Lecture 4: Grover's Algorithm, *Carnegie Mellon University*, Sep. 21, 2015.

Figure 1B:
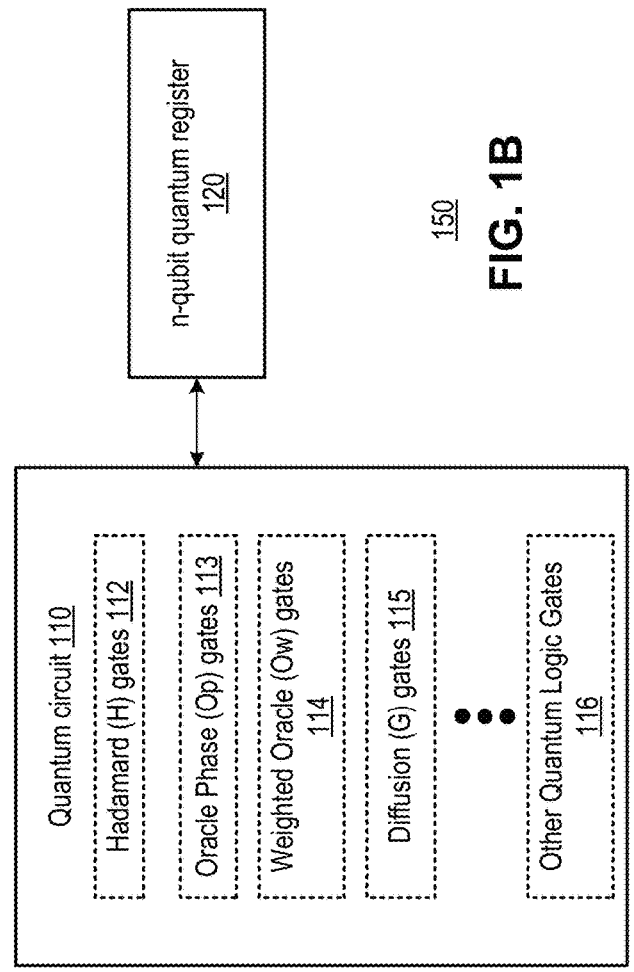
FIG. 1B is a block diagram of an embodiment of a quantum computing architecture in accordance with various embodiments.

FIG. 1B is a block diagram 150 of an embodiment of a quantum computing architecture in accordance with the present invention. In particular, a quantum circuit 110 is presented that includes one or more Hadamard (H) gates 112 that apply Hadamard transforms to one or more of the plurality of qubits; phase oracle (Op) gates that call a quantum oracle phase operator on the corresponding plurality of qubits (e.g. qubit states) and/or weighted oracle (Ow) gates that call a quantum weighted oracle operator on the corresponding plurality of qubits (e.g. qubit states) to produce a sequence of quantum oracle calls; and/or Grover diffusion gates (G) that apply one or more different diffusion operators. The other quantum logic gates 116, when present, can further include X gates, Y gates, Z gates, phase shift gates, controlled gates, such as CX, CY and/or CZ gates, swap gates, Toffoli gates, Deutsch gates, Ising gates, Fredkin gates, Adalus gates and/or other quantum logic gates and combinations thereof in various circuit configurations. In operation, the quantum circuit 110 generates a quantum computing result based on a measurement from the plurality of qubits—with or without the use of additional (ancillary or ancilla) working qubits.

Consider an example implementation of Grover's algorithm where a quantum circuit 110 uses oracle testing for the solution in an n-qubit quantum computer register 120 containing the superposition of all the candidate solutions—created using Hadamard transforms on the qubits in a said register and may or might not use additional (ancillary) working qubits. As used in this context, the quantum oracle function (such as a phase oracle function or weighted oracle function) can be part of or external to the computation pictured. Furthermore, the oracle function can be a "black box" or be another quantum function where the gates constituting it can be modified or otherwise produce an oracle result, as a part of the computation described (e.g., like a function testing the satisfiability of a set of clauses by the assignments of variables in the superposition). The quantum circuit 110 can further be used in circuit implementations of other quantum solutions, in addition to the example implementation of Grover's Algorithm above.

In various embodiments, the H gates 112, Op gates 113, Ow gates 114, G gates and other quantum logic gates 116 of the quantum circuit 110 can be implemented with one or more processing devices. Each such processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. Each such processing device can operate in conjunction with an attached memory and/or an integrated memory element such as classical memory or other memory device, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information.

Note that if the quantum circuit 110 is implemented via more than one processing device, the processing devices may be centrally located (e.g., directly coupled together via a wired and/or wireless bus structure) or may be distributedly located (e.g., cloud computing via indirect coupling via a local area network and/or a wide area network). Further note that if the quantum circuit 110 implements one or more of its gates or other functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, a memory can store, and a processing device can execute, hard coded and/or other operational instructions corresponding to at least some of the steps and/or functions illustrated in one or more of the Figures. Such a memory device or memory element can be tangible memory device or other non-transitory storage medium included in or implemented as an article of manufacture.

Further discussion regarding the operation of the quantum circuit 110, including several optional functions and features are described in conjunction with the figures that follow.

Figure 2A:
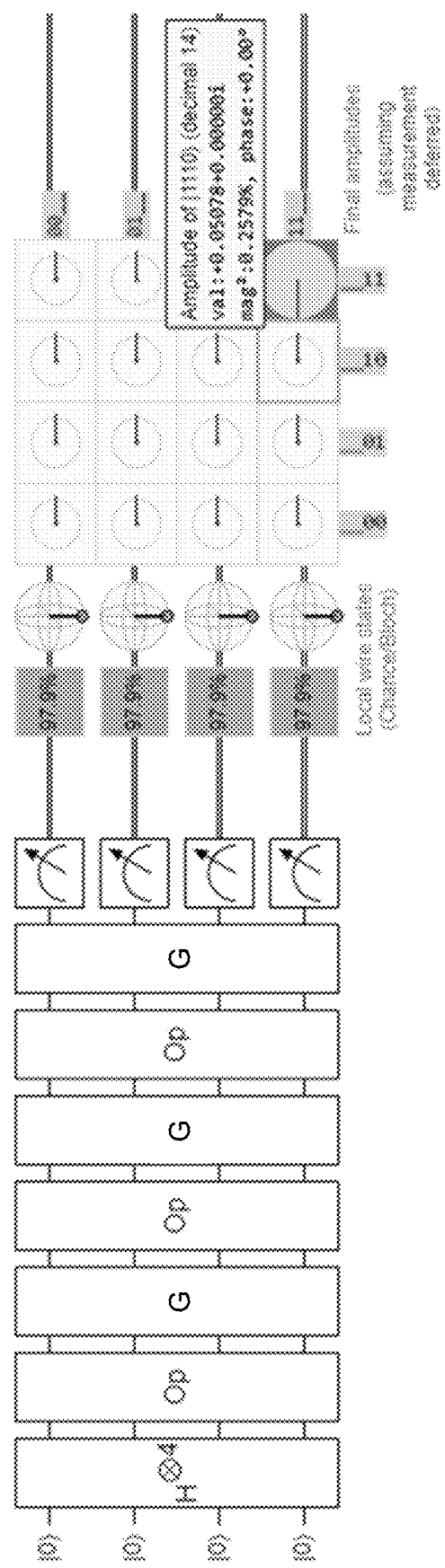
FIG. 2A is a schematic block diagram of a quantum circuit in accordance with various embodiments.

FIG. 2A is a schematic block diagram 200 of a quantum circuit in accordance with various embodiments. In particular, an example implementation of quantum circuit 110 is presented. In particular, a 4-qubit example is shown. The wire state for each qubit is shown in a Bloch-sphere representation for purposes of illustration.

For the purposes of this disclosure, a phase oracle gate (or simply phase oracle) can be defined in terms of a Boolean function in the following manner. Given a Boolean function:

$$f:\{0, 1\}^n \rightarrow \{0, 1\}$$

we define a unitary operator $O_P$ such that $$O_P|x\rangle = (-1)^{f(x)}|x\rangle$$

Furthermore, a Grover Diffusor Operator can be defined as an operator of the form $$2|u\rangle\langle u| - I$$

where $$u = \frac{1}{\sqrt{N}}\sum_{k=0}^{N-1}|k\rangle$$

An example implementation is presented of Grover's algorithm where a quantum circuit 110 uses oracle testing for the solution in an n-qubit quantum computer register 120 containing the superposition of all the candidate solutions—created using Hadamard transforms on the qubits in a said register without the use additional (ancillary) working qubits. The four qubit states are initialized to zero. In this example phase oracle gates (Op) can be used to call a phase oracle operator on the four qubit states to produce a sequence of quantum oracle calls. A plurality of diffusion gates (G) are provided that apply the Grover diffusion operator after each of the phase oracle calls in the sequence of oracle calls. The quantum circuit 110 generates a quantum computing result based on a measurement from the plurality of qubits, after having applied the sequence of phase oracle calls and the plurality of diffusion operators.

Figure 2B:
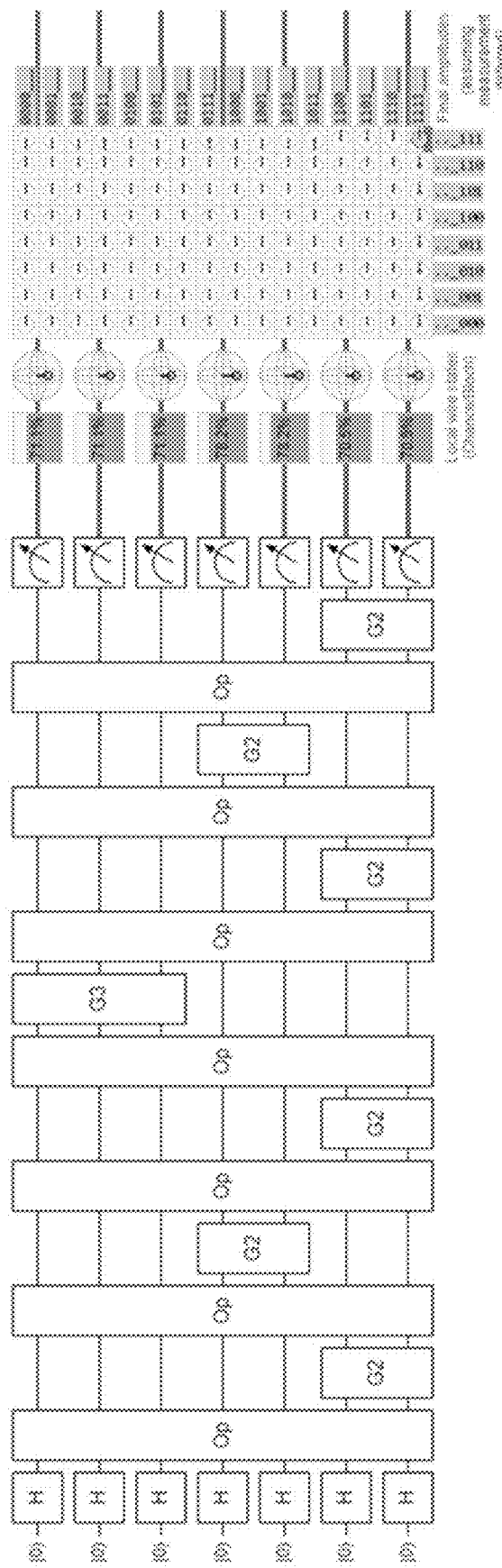
FIG. 2B is a schematic block diagram of a quantum circuit in accordance with various embodiments.

FIG. 2B is a schematic block diagram 210 of a quantum circuit in accordance with various embodiments. In particular, an example implementation of quantum circuit 110 is presented. In particular, a 7-qubit example is shown. The wire state for each qubit is shown in a Bloch-sphere representation for purposes of illustration.

Another example implementation of Grover's algorithm is presented where a quantum circuit 110 uses oracle testing for the solution in an n-qubit quantum computer register 120 containing the superposition of all the candidate solutions—created using Hadamard transforms on the qubits in a said register and without the use of additional (ancillary) working qubits. In this example phase oracle gates (Op) are used to call a phase oracle operator on a plurality of qubit states to produce a sequence of phase oracle calls. A plurality of diffusion gates (G) can apply a plurality of different diffusion operators, wherein a selected one or more of a plurality of diffusion operators is applied after each of the phase oracle calls in the sequence of oracle calls. While a plurality of different diffusion operators are used, one or more of these different diffusion operators can be applied more than once. The quantum circuit 110 generates a quantum computing result based on a measurement from the plurality of qubits, after having applied the sequence of phase oracle calls and the plurality of diffusion operators.

In various embodiments, different diffusion operators can operate similarly to Grover's diffusion operator, but operate as micro-diffusors on only a subset of wirelines/qubits, as opposed to all of the qubits in the register. In the example shown, each of three different diffusion operators operates on a unique (different) non-zero proper subset of the plurality of qubits. These different diffusion operators can include, in the example shown, two different 2-qubit operators acting only on neighboring qubits and a third diffusion operating on three neighboring qubits. The first diffusion operator (operating on the bottom two qubits) is applied four times, the second diffusion operator (operating on the middle two qubits) is applied twice and the third diffusion operator (operating on the top three qubits) is applied only once. The full quantum circuit 110 yields the desired result with certainty.

Furthermore, in the example shown, the plurality of diffusion operators, taken as a group, operate on each of the plurality of wirelines/qubits. In particular, the union of the unique non-zero proper subsets corresponding to each of the diffusion operators spans the entire set of wirelines/qubits of the circuit. In addition, each of the diffusion operators operates on two or more of the wirelines/qubits of the circuit.

Other examples of micro-diffusion operators operating on any p-neighboring qubits, and/or other selected subsets of qubits, etc., can likewise be employed. Other non-Grover diffusion operators can be employed as well. Furthermore, the diffusion operators may or may not act on the same qubits and may or may not be identical up to the choice of qubits they act on. The diffusion operators are able to reach each of the states need to be chosen so if one of them acts on a subset of states in such a way that the output belongs to the same subset, then there is another operator, generating the output outside of this subset when acting on the input state in the set.

The phase oracles and the diffusion operators can be used in different sequences that shown, and the order of applying these diffusion operators can be optimized to find the partial solution rather than the final one, for example, to be subsequently used with another circuit utilizing the same oracle or a different oracle, such as a simpler oracle. The oracle/diffusion operator sequence can be optimized so a measurement, such as a measurement of an ancillary qubit or other qubit, will allow for conditional execution of subsequent parts of the circuit, for all or nearly all measurement results, so the total probability of success is increased in comparison with just the final measurement. The oracle/diffusion operator sequence can be optimized, for example, to generate shorter circuits with lower success probability than longer ones, resulting in lower expected number of the oracle calls needed to obtain the solution.

In various embodiments, the diffusion operators can be constructed so the complexity of oracles is reduced around diffusion operators G, by omitting parts of circuits of oracles commuting with G with no change to the result. In accordance with this example, access to the oracle is available, such as the case of oracle testing satisfiability of the assignment of variables in a Boolean satisfiability problem, other satisfiability problem, or other problem were access to the oracle is possible. Scaling of the complexity of the circuit with increased size the database's number of records is no worse than O(Log(N)*sqrt(N)), this can be further optimized on the case by case basis, depending on the particular quantum computing problem being solved.

Figure 2C:
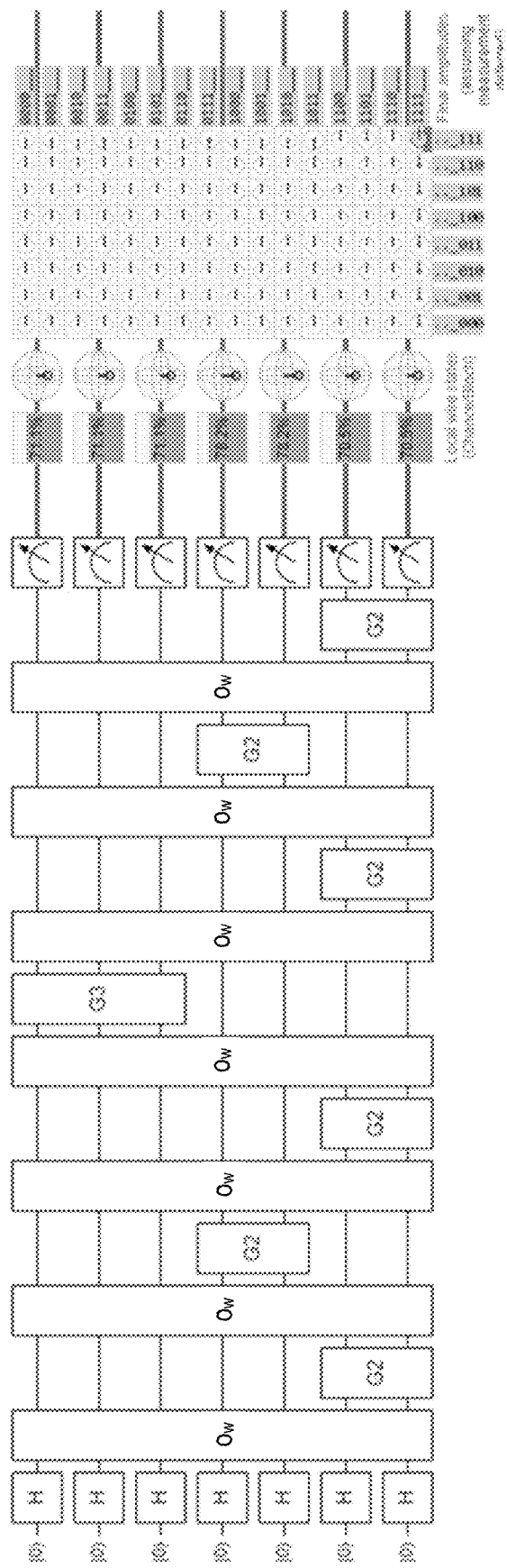
FIG. 2C is a schematic block diagram of a quantum circuit in accordance with various embodiments.

FIG. 2C is a schematic block diagram of a quantum circuit in accordance with various embodiments. In particular, another example implementation of quantum circuit 110 is presented. In particular, another 7-qubit example is shown. The wire state for each qubit is shown in a Bloch-sphere representation for purposes of illustration.

Oracles of the following form have been attempted:

$$\overline{O}_W(t)|x\rangle := e^{i\pi f(x)}|x\rangle$$

for most f(x), however, this oracle type requires an exponential number of oracle evaluations and diffusion operators calls to obtain required distribution. This is the result of the decreasing difference between the phases introduced by f(x) and the "zero phase". Decaying phases introduced by the oracle result in a decaying rate of amplitude accumulation.

For the purposes of this disclosure, a weighted oracle gate (or simply weighted oracle) can be defined in the following manner that is based on an additional function g. For a given real-valued function $f:\{0, 1\}^n \to \mathbb{R}$ and $$g:\mathbb{R} \times N \to \mathbb{R},$$

we define a corresponding unitary operator $O_W(t)$ such that for t-th iteration (e.g. corresponding to the t-th quantum oracle call in the sequence of quantum oracle calls) and the state from computational basis $|x\rangle$ we have:

$$O_w(t)|x\rangle := e^{i\pi g(f(x),t)}|x\rangle$$

The g function is a function of two parameters in the exponent that can be represented by g(s, t). The g function is an adjustable function tweaking (e.g., correcting, changing or adjusting) the phase rotation between subsequent iterations. In the simplest cases g(s, t) could be as follows:

$$g(s, t) = s$$
$$g(s, t) = (-1)^t s$$

This particular, the function g operates by inverting the phases introduced by the oracle in the even-indexed iterations. Notice that this can be used as a universal correction function as it doesn't depend on f. Intuitively, by flipping the sign of the phase every other iteration, the decay factor is introduced in the opposite direction, indirectly fixing the phase lost to decay in the previous iteration. For example, −5 added to 100 is 95, which is the decay. Then, −5 added to −95 (i.e. the sign flipped 95) is −100, which, in absolute value, brings back the correct value of 100. Other, potentially better-tuned functions, can be found using numerical optimization for a given f.

In the example shown in FIG. 2C, the phase oracles of FIG. 2B are replaced by weighted oracles. Compared to the classical Grover's algorithm, the usage of quantum weighted oracles makes possible sampling from a distribution spread across many states with the probability proportional to the oracles' weights.

Figure 2D:
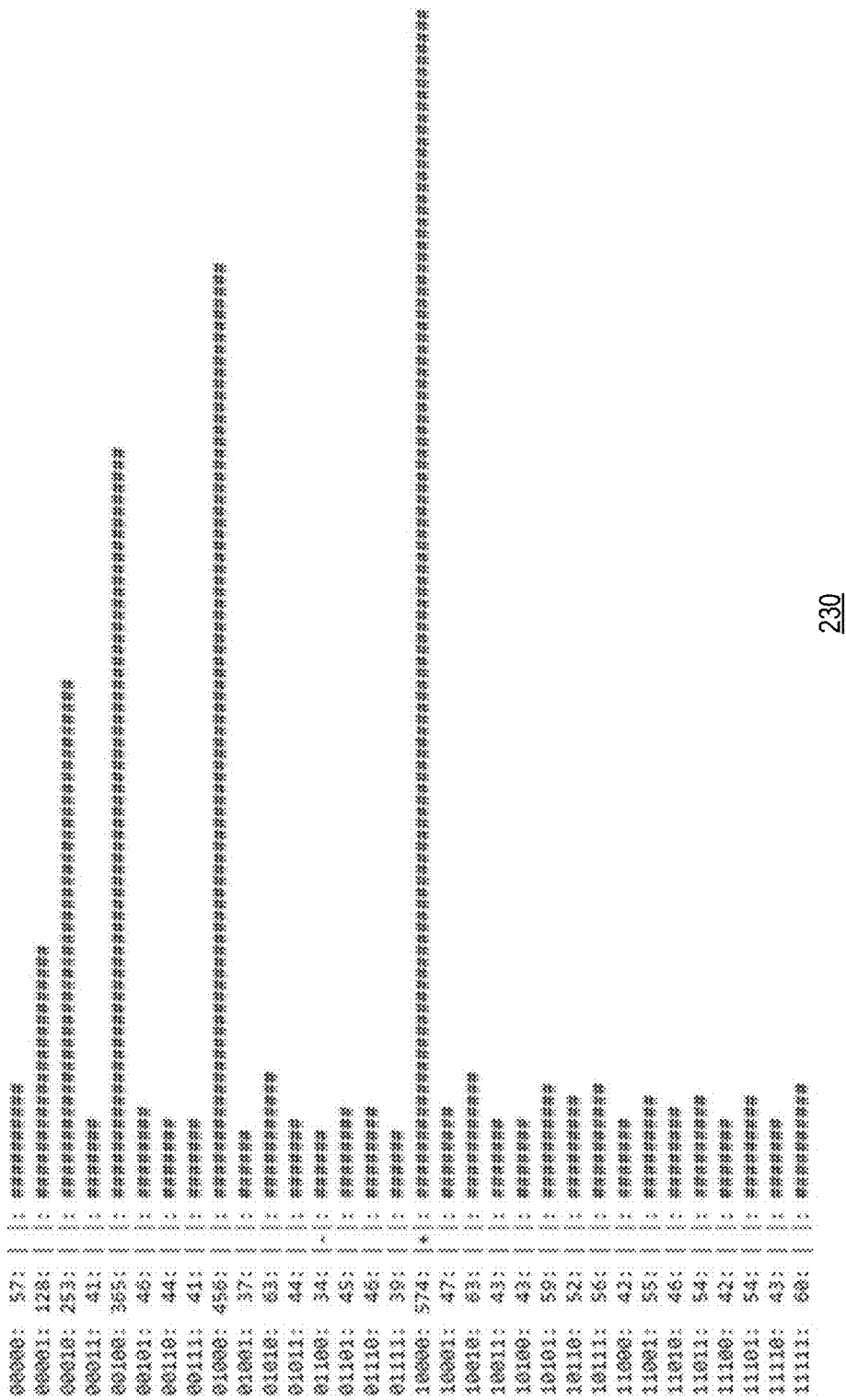
FIG. 2D is a histogram of collected amplitudes based on sample weights for a quantum circuit in accordance with various embodiments.

FIG. 2D is a histogram 230 of collected amplitudes based on sample weights for a quantum circuit in accordance with various embodiments. In particular, consider a set of weights below are presented for a 5-qubit example, otherwise similar to the 7-qubit example of FIG. 2C:

('00001', 3.5 / 8.0 * pi), ('00010', 5.0 / 8.0 * pi), ('00100', 6.0 / 8.0 * pi), ('01000', 7.0 / 8.0 * pi), ('10000', 8.0 / 8.0 * pi)

A histogram of collected amplitudes is presented, based on these weights.

FIG. 3 is a flow diagram 300 of an embodiment of a method in accordance with the present invention. In particular, a method is presented for use with one or more functions and features described in conjunctions with FIGS. 1 and 2A-2D. Step 302 includes applying, via a plurality of Hadamard gates of the quantum circuit, Hadamard transforms to the plurality of qubits in a corresponding plurality of initial states. Step 304 includes sequentially calling, via a plurality of weighted oracle gates of the quantum circuit, a weighted oracle operator on the plurality of qubits to produce a sequence of quantum oracle calls, wherein the weighted oracle operator for the plurality of qubits applies an adjustable phase rotation at each of the quantum oracle calls in the sequence of quantum oracle calls. Step 306 includes applying, via a plurality of diffusion gates of the quantum circuit, a plurality of diffusion operators, wherein a selected one or more of a plurality of diffusion operators is applied after each of the quantum oracle calls in the sequence of quantum oracle calls. Step 308 includes generating a quantum computing result based on a measurement from the plurality of qubits, after having applied the sequence of quantum oracle calls and the plurality of diffusion operators.

In various embodiments, each of the plurality of diffusion operators operates on a unique non-zero proper subset of the plurality of qubits. The unique non-zero proper subset of the plurality of qubits can include two or more neighboring qubits of the plurality of qubits. The weighted oracle operator for each one of the plurality of qubits can be in accordance with a weight associated with the one of the plurality of qubits. The weighted oracle operator for the plurality of qubits can be in accordance with weights associated with each of the plurality of qubits and wherein the weights are selected in accordance with a probability distribution across a plurality of qubit states.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, a quantum register or other quantum memory and/or any other device that stores data in a non-transitory manner. Furthermore, the memory device may be in a form of a solid-state memory, a hard drive memory or other disk storage, cloud memory, thumb drive, server memory, computing device memory, and/or other non-transitory medium for storing data. The storage of data includes temporary storage (i.e., data is lost when power is removed from the memory element) and/or persistent storage (i.e., data is retained when power is removed from the memory element). As used herein, a transitory medium shall mean one or more of: (a) a wired or wireless medium for the transportation of data as a signal from one computing device to another computing device for temporary storage or persistent storage; (b) a wired or wireless medium for the transportation of data as a signal within a computing device from one element of the computing device to another element of the computing device for temporary storage or persistent storage; (c) a wired or wireless medium for the transportation of data as a signal from one computing device to another computing device for processing the data by the other computing device; and (d) a wired or wireless medium for the transportation of data as a signal within a computing device from one element of the computing device to another element of the computing device for processing the data by the other element of the computing device. As may be used herein, a non-transitory computer readable memory is substantially equivalent to a computer readable memory. A non-transitory computer readable memory can also be referred to as a non-transitory computer readable storage medium.

One or more functions associated with the methods and/or processes described herein can be implemented via a processing module that operates via the non-human "artificial" intelligence (AI) of a machine. Examples of such AI include machines that operate via anomaly detection techniques, decision trees, association rules, expert systems and other knowledge-based systems, computer vision models, artificial neural networks, convolutional neural networks, support vector machines (SVMs), Bayesian networks, genetic algorithms, feature learning, sparse dictionary learning, preference learning, deep learning and other machine learning techniques that are trained using training data via unsupervised, semi-supervised, supervised and/or reinforcement learning, and/or other AI. The human mind is not equipped to perform such AI techniques, not only due to the complexity of these techniques, but also due to the fact that artificial intelligence, by its very definition—requires "artificial" intelligence—i.e. machine/non-human intelligence.

One or more functions associated with the methods and/or processes described herein can be implemented as a large-scale system that is operable to receive, transmit and/or process data on a large-scale. As used herein, a large-scale refers to a large number of data, such as one or more kilobytes, megabytes, gigabytes, terabytes or more of data that are received, transmitted and/or processed. Such receiving, transmitting and/or processing of data cannot practically be performed by the human mind on a large-scale within a reasonable period of time, such as within a second, a millisecond, microsecond, a real-time basis or other high speed required by the machines that generate the data, receive the data, convey the data, store the data and/or use the data.

One or more functions associated with the methods and/or processes described herein can require data to be manipulated in different ways within overlapping time spans. The human mind is not equipped to perform such different data manipulations independently, contemporaneously, in parallel, and/or on a coordinated basis within a reasonable period of time, such as within a second, a millisecond, microsecond, a real-time basis or other high speed required by the machines that generate the data, receive the data, convey the data, store the data and/or use the data.

One or more functions associated with the methods and/or processes described herein can be implemented in a system that is operable to electronically receive digital data via a wired or wireless communication network and/or to electronically transmit digital data via a wired or wireless communication network. Such receiving and transmitting cannot practically be performed by the human mind because the human mind is not equipped to electronically transmit or receive digital data, let alone to transmit and receive digital data via a wired or wireless communication network.

One or more functions associated with the methods and/or processes described herein can be implemented in a system that is operable to electronically store digital data in a memory device. Such storage cannot practically be performed by the human mind because the human mind is not equipped to electronically store digital data.

One or more functions associated with the methods and/or processes described herein may operate to cause an action by a processing module directly in response to a triggering event—without any intervening human interaction between the triggering event and the action. Any such actions may be identified as being performed "automatically", "automatically based on" and/or "automatically in response to" such a triggering event. Furthermore, any such actions identified in such a fashion specifically preclude the operation of human activity with respect to these actions—even if the triggering event itself may be causally connected to a human activity of some kind.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use with a quantum circuit and a quantum register having a plurality of qubits, the method comprising:
   applying, via a plurality of Hadamard gates of the quantum circuit, Hadamard transforms to the plurality of qubits in a corresponding plurality of initial states;
   sequentially calling, via a plurality of weighted oracle gates of the quantum circuit, a weighted oracle operator on the plurality of qubits to produce a sequence of quantum oracle calls, wherein the weighted oracle operator for the plurality of qubits applies an adjustable phase rotation at each of the quantum oracle calls in the sequence of quantum oracle calls;
   applying, via a plurality of diffusion gates of the quantum circuit, a plurality of diffusion operators, wherein a selected one or more of a plurality of diffusion operators is applied after each of the quantum oracle calls in the sequence of quantum oracle calls; and
   generating a quantum computing result based on a measurement from the plurality of qubits, after having applied the sequence of quantum oracle calls and the plurality of diffusion operators.

2. The method of claim 1, wherein each of the plurality of diffusion operators operates on a corresponding unique non-zero proper subset of the plurality of qubits.

3. The method of claim 2, wherein each corresponding unique non-zero proper subset of the plurality of qubits includes two or more neighboring qubits of the plurality of qubits.

4. The method of claim 2, wherein the plurality of diffusion operators operate on each of the plurality of qubits.

5. The method of claim 1, wherein the weighted oracle operator for each one of the plurality of qubits is in accordance with a weight associated with the one of the plurality of qubits.

6. The method of claim 1, wherein the weighted oracle operator for the plurality of qubits is in accordance with weights associated with each of the plurality of qubits and wherein the weights are selected in accordance with a probability distribution across a plurality of qubit states.

7. The method of claim 1, wherein the weighted oracle operator for the plurality of qubits is a unitary operator.

8. The method of claim 1, the weighted oracle operator for a t-th quantum oracle call in the sequence of quantum oracle calls and for a qubit state from computational basis $|x\rangle$ is determined by:

$$O_w(t)|x\rangle := e^{i\pi g(f(x),t)}|x\rangle$$

where g is a function that applies an adjustable phase rotation f(x) as a further function of t.

9. The method of claim 1, wherein:

$$g(s, t) = (-1)^t s.$$

10. The method of claim 1, wherein f(x) is determined based on a numerical optimization.

11. A quantum circuit operating on a plurality of qubits, the quantum circuit comprising:

a plurality of Hadamard gates configured to apply Hadamard transforms to the plurality of qubits in a corresponding plurality of initial states;

a plurality of weighted oracle gates configured to sequentially call a weighted oracle operator on the plurality of qubits to produce a sequence of quantum oracle calls, wherein the weighted oracle operator for the plurality of qubits applies an adjustable phase rotation at each of the quantum oracle calls in the sequence of quantum oracle calls;

a plurality of diffusion gates configured to apply a plurality of diffusion operators, wherein a selected one or more of a plurality of diffusion operators is applied after each of the quantum oracle calls in the sequence of quantum oracle calls; and a measurement function configured to generate a quantum computing result based on a measurement from the plurality of qubits, after the sequence of quantum oracle calls are applied and after the plurality of diffusion operators are applied.

12. The quantum circuit of claim 11, wherein each of the plurality of diffusion operators operates on a corresponding unique non-zero proper subset of the plurality of qubits.

13. The quantum circuit of claim 12, wherein each corresponding unique non-zero proper subset of the plurality of qubits includes two or more neighboring qubits of the plurality of qubits.

14. The quantum circuit of claim 12, wherein the plurality of diffusion operators operate on each of the plurality of qubits.

15. The quantum circuit of claim 11, wherein the weighted oracle operator for each one of the plurality of qubits is in accordance with a weight associated with the one of the plurality of qubits.

16. The quantum circuit of claim 11, wherein the weighted oracle operator for the plurality of qubits is in accordance with weights associated with each of the plurality of qubits and wherein the weights are selected in accordance with a probability distribution across a plurality of qubit states.

17. The quantum circuit of claim 11, wherein the weighted oracle operator for the plurality of qubits is a unitary operator.

18. The quantum circuit of claim 11, wherein the weighted oracle operator for a t-th quantum oracle call in the sequence of quantum oracle calls and for a qubit state from computational basis $|x\rangle$ is determined by:

$$O_w(t)|x\rangle := e^{i\pi g(f(x),t)}|x\rangle$$

where g is a function that applies an adjustable phase rotation f(x) as a further function of t.

19. The quantum circuit of claim 11, wherein:

$$g(s, t) = (-1)^t s.$$

20. The quantum circuit of claim 11, wherein f(x) is determined based on a numerical optimization.

* * * * *